US007085141B2

(12) United States Patent
Yi

(10) Patent No.: US 7,085,141 B2
(45) Date of Patent: Aug. 1, 2006

(54) METHODS AND APPARATUS FOR HOLDING CIRCUIT BOARDS TOGETHER

(75) Inventor: George Youzhi Yi, Fremont, CA (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 10/976,521

(22) Filed: Oct. 29, 2004

(65) Prior Publication Data
US 2006/0092616 A1    May 4, 2006

(51) Int. Cl.
H05K 1/14    (2006.01)
(52) U.S. Cl. .................. 361/804; 361/742; 361/758; 361/770; 174/138 E; 174/138 G; 29/830
(58) Field of Classification Search ............. 361/742, 361/758, 804, 770; 174/138 G, 138 E; 29/830, 29/831
See application file for complete search history.

(56) References Cited

U.S. PATENT DOCUMENTS

| | | | | |
|---|---|---|---|---|
| 4,297,769 A * | 11/1981 | Coules | .................. | 174/138 D |
| 4,629,356 A * | 12/1986 | Hayashi | .................. | 403/408.1 |
| D293,880 S * | 1/1988 | Takahashi | .................. | D8/354 |
| 4,781,488 A * | 11/1988 | Hayashi | .................. | 403/408.1 |
| D324,168 S * | 2/1992 | Fujioka | .................. | D8/354 |
| 5,956,835 A * | 9/1999 | Aksu | .................. | 29/468 |
| 5,963,432 A * | 10/1999 | Crowley | .................. | 361/804 |
| 6,124,552 A * | 9/2000 | Boe | .................. | 174/135 |
| 6,140,591 A * | 10/2000 | Osborne et al. | ........ | 174/138 E |
| 6,308,394 B1 * | 10/2001 | Boe | .................. | 29/450 |
| 6,404,646 B1 * | 6/2002 | Tsai et al. | .................. | 361/758 |
| 6,470,556 B1 * | 10/2002 | Boe | .................. | 29/450 |
| 6,711,030 B1 * | 3/2004 | Akiba | .................. | 361/803 |

* cited by examiner

Primary Examiner—Kamand Cuneo
Assistant Examiner—Dameon E. Levi
(74) Attorney, Agent, or Firm—BainwoodHuang

(57) ABSTRACT

A circuit board holder includes a base portion, and a mounting portion coupled to the base portion. The mounting portion is configured to actuate with a first circuit board when the circuit board holder attaches to the first circuit board. The circuit board holder further includes a capturing portion coupled to the base portion. The capturing portion is configured to capture an edge of a second circuit board when the circuit board holder attaches to the first circuit board and when the second circuit board electrically connects with the first circuit board. Such a holder alleviates the need to consume a large amount of circuit board space on the second circuit board. Furthermore, the use of such a circuit board holder enables the first and second circuit boards to maintain reliable electrical connectivity even when exposed to heavy shock or vibration.

22 Claims, 6 Drawing Sheets

METHODS AND APPARATUS FOR HOLDING CIRCUIT BOARDS TOGETHER

BACKGROUND

There are a variety of conventional circuit board connectors available to electrically connect two circuit boards together. For example, some connectors connect relatively large circuit board modules to even larger backplanes or midplanes. As another example, some connectors connect daughter cards such as miniature circuit boards and multichip modules to motherboards.

In some situations, the connectors provide enough mechanical retaining force to hold the two circuit boards reliably together without additional assistance. However, in other situations, the mechanical retaining force may be insufficient to hold the two circuit boards together without such assistance.

One conventional approach to holding two circuit boards together employs additional metallic hardware. For example, some manufacturers supplement connectors by adding standoffs, bolts or screws to hold the two circuit boards in place.

Another conventional approach to holding two circuit boards together employs plastic standoffs which extend between two circuit boards. Such standoffs provides support and improves retention over that provided by circuit board connectors alone.

SUMMARY

Unfortunately, there are deficiencies to the above-described conventional approach to holding two circuit boards together using metallic hardware. In particular, the use of such hardware typically requires the dedication of a significant amount of circuit board space on both circuit boards for holes, keep-out regions, etc. However, adequate space on both circuit boards is often not available and, even if such space is available, such space is typically expensive since circuit board features (e.g., traces, components, etc.) on both circuit boards may need to be displaced and/or premium prices must be paid to shrink the sizes of neighboring electronic circuit board devices.

Additionally, hardware (plastic standoffs, metallic standoffs, bolts, screws, nuts, etc.) is typically cumbersome to install. In some situations, the manufacturer may need to modify an automated assembly process (e.g., using automated equipment) to include the installation of such hardware. In other situations, the manufacturer may need to train and employ technicians to manually install the hardware.

Furthermore, metallic hardware is a source of electrically conductive contamination (e.g., a source of metallic filings and debris, a source of inadvertently dislodged hardware, etc.) thus posing a quality control concern to the manufacturer. Such contamination could cause inadvertent shorts between electrical features resulting in operation errors. In some situations, the effects may be catastrophic, e.g., the metallic hardware could cause an electric short between electrical features resulting in damage to the circuit boards or even a fire.

In contrast to the above-described conventional approach to holding two electrically connected circuit boards together using metallic hardware, embodiments of the invention are directed to techniques for holding circuit boards together using a circuit board holder which attaches to a first circuit board and captures an edge of a second circuit board to hold the second circuit board in place. Such a holder alleviates the need to consume a large amount of circuit board space on the second circuit board. Furthermore, the reliable operation of the holder enables the first and second circuit boards to maintain robust electrically connectivity even when exposed to heavy shock or vibration.

One embodiment is directed to a circuit board holder which includes a base portion, and a mounting portion coupled to the base portion. The mounting portion is configured to actuate with a first circuit board when the circuit board holder attaches to the first circuit board. The circuit board holder further includes a capturing portion coupled to the base portion. The capturing portion is configured to capture an edge of a second circuit board when the circuit board holder attaches to the first circuit board and when the second circuit board electrically connects with the first circuit board.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to techniques for holding multiple circuit boards together using a circuit board holder which attaches to a first circuit board and captures an edge of a second circuit board to hold the second circuit board in place. Such a holder alleviates the need to consume a large amount of circuit board space on the second circuit board. Additionally, the reliable operation of the holder enables the first and second circuit boards to maintain electrical connectivity even when exposed to heavy shock or vibration.

Figure 1:
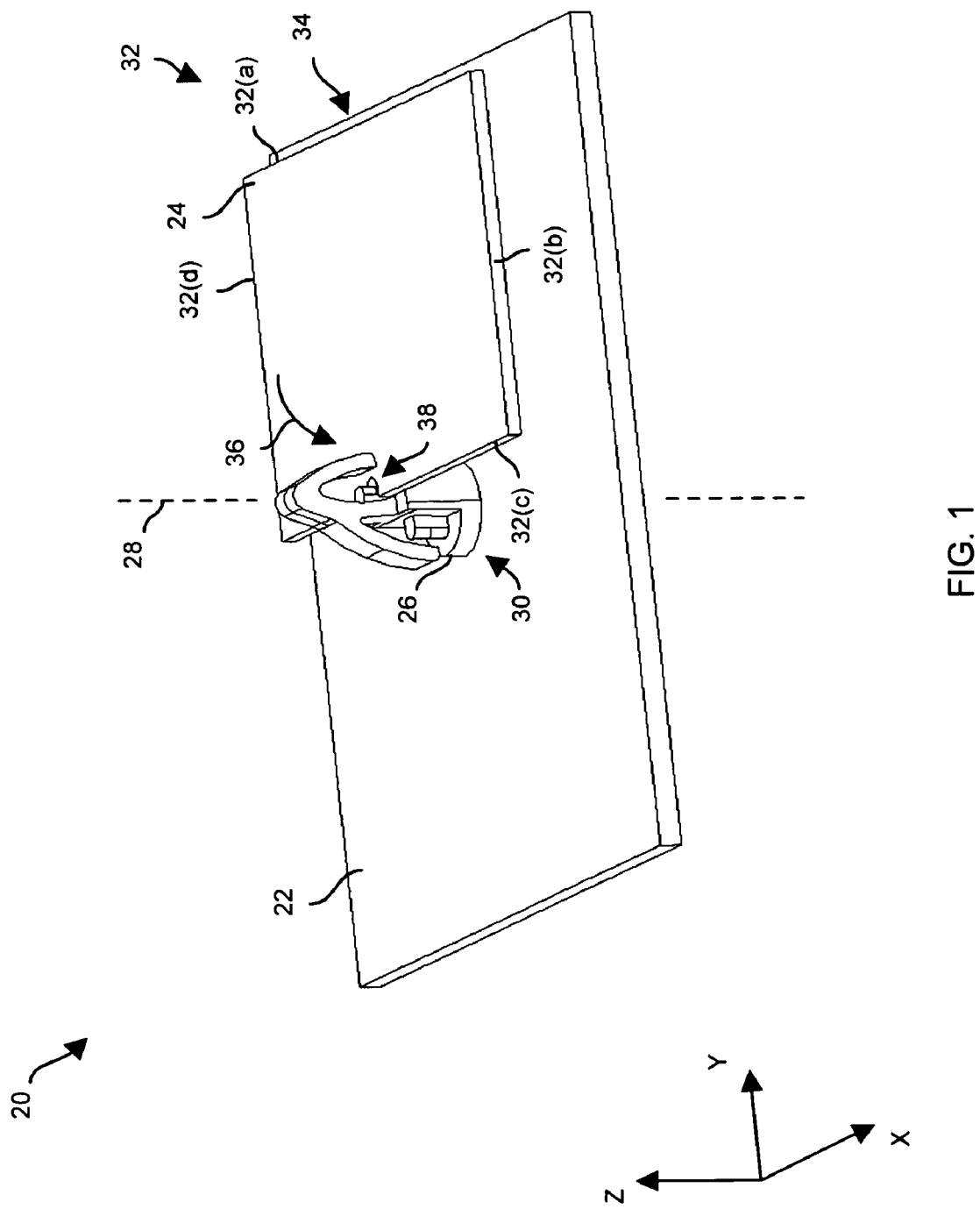
FIG. 1 is a perspective view of a connection system which is suitable for use by the invention.

FIG. 1 shows a connection system 20 which is suitable for use by the invention. The connection system 20 includes a main circuit board 22, a second circuit board 24 and a circuit board holder 26. Both the main circuit board 22 and the second circuit board 24 are planar in shape and extend along the X-Y planes. The circuit board holder 26 extends in a direction 28 (i.e., the Z-axis) which is substantially perpendicular to the circuit boards 22, 24.

To attach the circuit board holder 26 to the main circuit board 22 no hardware or solder is required. Rather, the circuit board holder 26 simply inserts, in the direction 28, through a hole 30 defined by the main circuit board 22 until parts of the circuit board holder 26 interlock with portions of the main circuit board 22 adjacent the hole 30. The crosssection of the circuit board holder 26 and the hole 30 share a unique shape (e.g., a keyhole shape) that (i) guarantees proper rotational orientation of the circuit board holder 26 relative to the main circuit board 22, and (ii) prevents the circuit board holder 26 from rotating about the axis 28 once the circuit board holder 26 attaches to the main circuit board 22.

As further shown in FIG. 1, the circuit board 24 defines a set of edges 32(a), 32(b), 32(c), 32(d) (collectively, edges 32). During connection of the circuit board 24 with the main circuit board 22, the edge 32(a) of the circuit board 24 partially installs into a connector 34 of the main circuit board 22 (i.e., the connector 34 is shown generally by the arrow 34). Next, the opposite edge 32(c) of the circuit board 24 pivots toward the circuit board holder 26 in a counterclockwise direction 36 about the X-axis. The circuit board holder 26 then captures the edge 32(c) as the opposite edge 32(a) settles into a secure position with the connector 34. The circuit board holder 26 engages with a notch 38 along the edge 32(c) of the circuit board 24 to prevent the circuit board 24 from sliding relative to the main circuit board 22 along the X-axis. At this point, the circuit boards 22, 24 are substantially parallel to each other in a robustly connected state, and the circuit board holder 26 reliably holds the circuit board 24 in electrical connection with the circuit board 22. Accordingly, the circuit board holder 26 is simpler and less cumbersome to use than conventional hardware. Furthermore, once everything is installed, the circuit board holder 26 inhibits inadvertent disconnection of the circuit boards 22, 24 even in situations of shock or vibration.

In one arrangement, the connector 34 is a mini-PCI socket, and the circuit board 24 is configured with a mini-PCI form factor. Since the circuit board holder 26 is configured to latch the second circuit board 24 along an edge 32(c), there no need for consumption of additional circuit board space on the second circuit board 24. Rather, the circuit board holder 26 holds the second circuit board 24 reliably in place relative to the main circuit board 22 while consuming only a very limited space along the edge 32(c). Further details of the invention will now be provided with reference to FIGS. 2 and 3.

Figure 2:
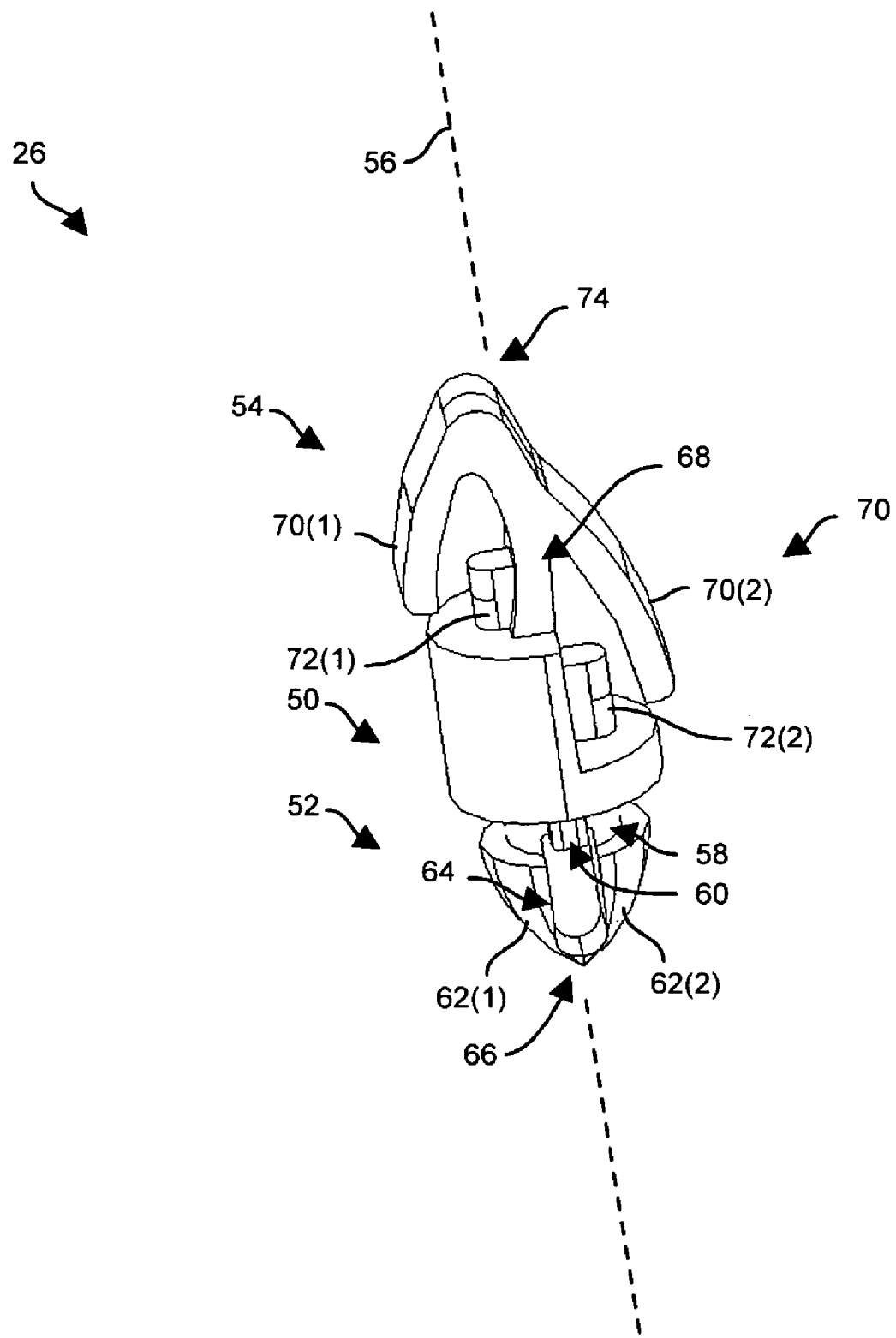
FIG. 2 is a perspective view of a circuit board holder of the connection system of FIG. 1.
Figure 3:
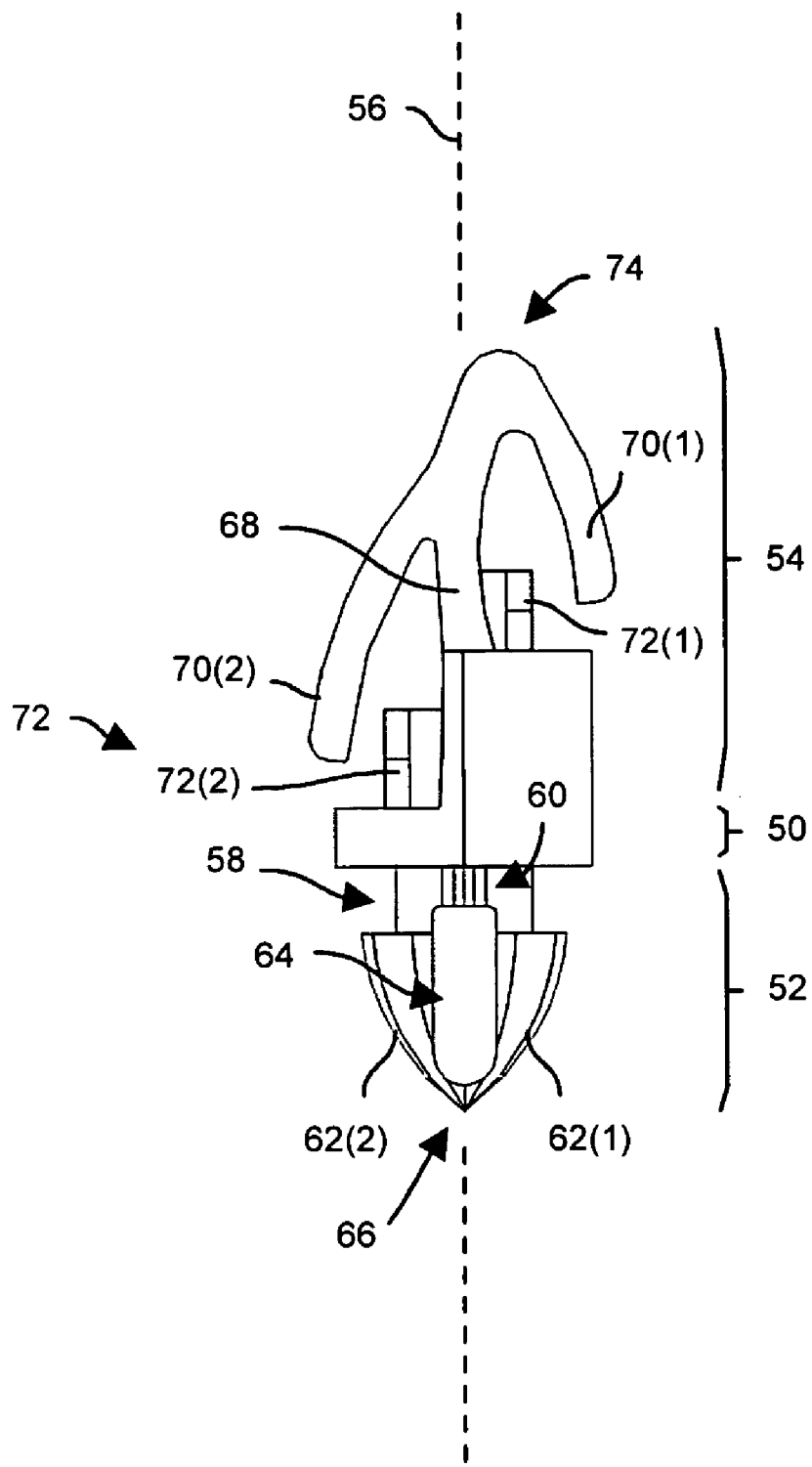
FIG. 3 is a side view of the circuit board holder of FIG. 2.

FIG. 2 is a perspective view of the circuit board holder 26, and FIG. 3 is a side view of the circuit board holder 26. As shown, the circuit board holder 26 includes a base portion 50, a mounting portion 52 and a capturing portion 54 which define a central axis 56. The mounting portion 52 defines a neck 58, a key 60, a pair of opposing tapered ramps 62(1), 62(2) (collectively, ramps 62), a relief gap 64, and an end 66. The capturing portion 54 includes a mid-support 68, deflectable latches 70(1), 70(2) (collectively, latches 70), keys 72(1), 72(2) (collectively, keys 72) and another end 74.

The mounting portion 52 is configured to actuate with the main circuit board 22 when the circuit board holder 26 attaches to the main circuit board 22. In particular, as the end 66 of the circuit board holder 26 passes through a hole 30 (also see FIG. 1) defined by the main circuit board 22, the opposing tapered ramps 62 squeeze against the circuit board 22 and compress toward the central axis 56 and the relief gap 64. Once the ramps 62 pass fully through the hole 30, the ramps 62 expand back to their original positions to snuggly lock the circuit board 22 between the mounting portion 52 and the base portion 50 (e.g., the circuit board holder 26 snaps into a tight fit with the main circuit board 22). The key 60, which is disposed adjacent the base portion 50 of the circuit board holder 26, engages with a gap portion of the hole 30 to prevent the circuit board holder 26 from rotating about the axis 56.

After the circuit board holder 26 is mounted to the main circuit board 22, the capturing portion 54 is configured to capture an edge 32(c) of a second circuit board 24 as the second circuit board 24 electrically connects with the main circuit board 22 (also see FIG. 1). In particular, as the circuit board 24 electrically connects with the main circuit board 22 (e.g., as the edge 32(a) inserts into a connector 34 of the main circuit board 22), the edge 32(c) moves against a deflectable latch 70 (e.g., the latch 70(1)) and deflects an end of that latch 70 toward the central axis 56 (e.g., see the arrow 36). Once the edge 32(c) clears the latch 70, the end of the latch 70 moves away from the central axis 56 back to its original orientation prior to deflection due to resiliency in the material of the circuit board holder 26. Accordingly, the latch 70 now provides interference if the edge 32(c) attempts to move in a direction opposite to the installation direction (i.e., a direction opposite the arrow 36) thus preventing the circuit board 24 from escaping electrical connectivity with the main circuit board 22.

It should be understood that the portions 50, 52, 54 of the circuit board holder 26 can be formed and assembled in a variety of ways. In some arrangements, the portions 50, 52, 54 are formed simultaneously as an integrated body of non-metallic material (e.g., compliant plastic) by an injection molding process (e.g., using a simple two-piece mold). In other arrangements, one or more of the portions 50, 52, 54 is formed separately from the others and then attached in a subsequent manufacturing step (e.g., glued, epoxied or melted together). Since the material forming the circuit board holder 26 is preferably non-conductive, there no likelihood that the circuit board holder 26 will cause electrical contamination.

It should be further understood that the tab 72(1) is configured to engage a corresponding notch 38 along the edge 32(c) while the circuit board 24 electrically connects with the main circuit board 22. Accordingly, the circuit board 24 is unable to slide planarly (i.e., there is no lateral sliding along the supported edge 32(c)) while the circuit board holder 26 holds the circuit board 22. Further details of particular embodiments of the invention will now be provided with reference to FIGS. 4 and 5.

Figure 4:
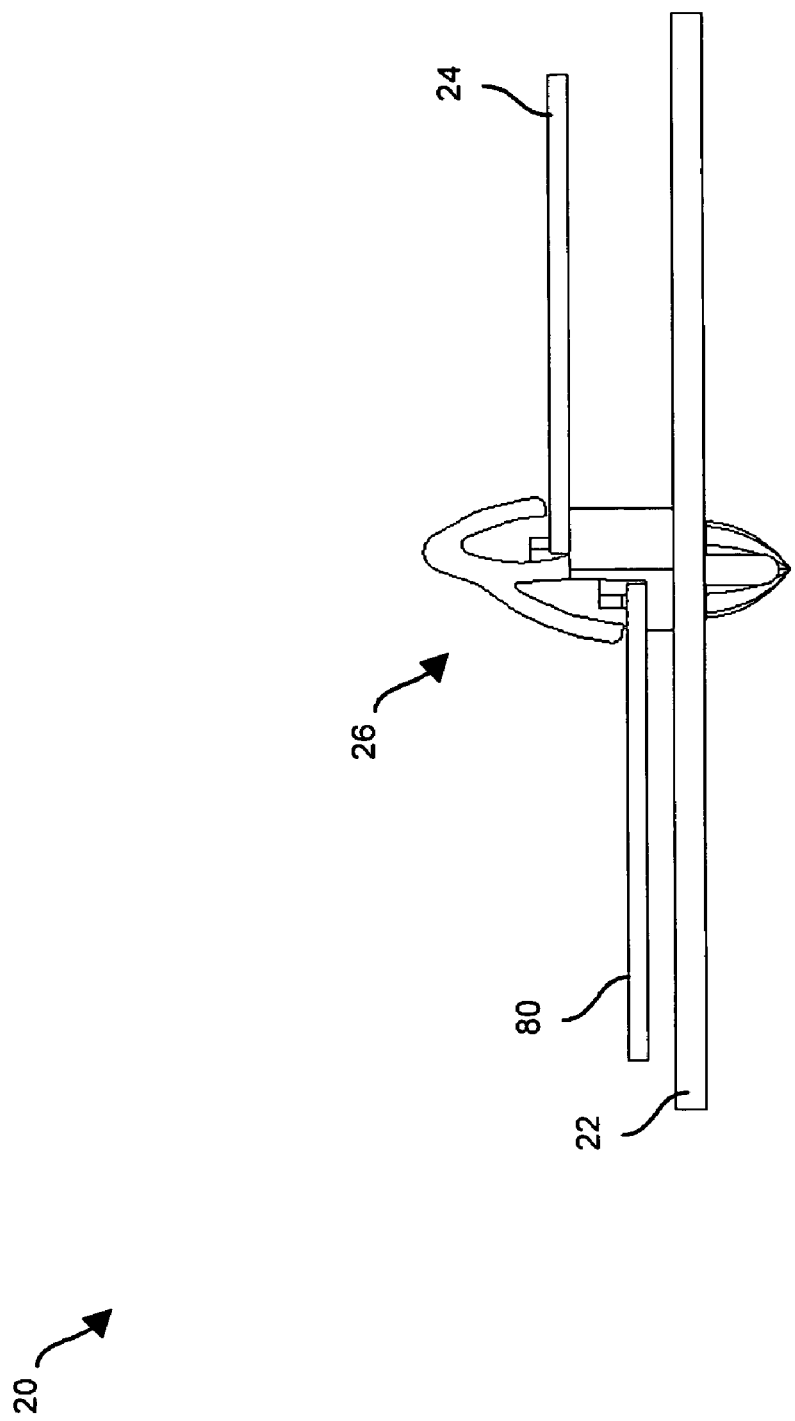
FIG. 4 is a side view of the connection system of FIG. 1 when holding three circuit boards together.
Figure 5:
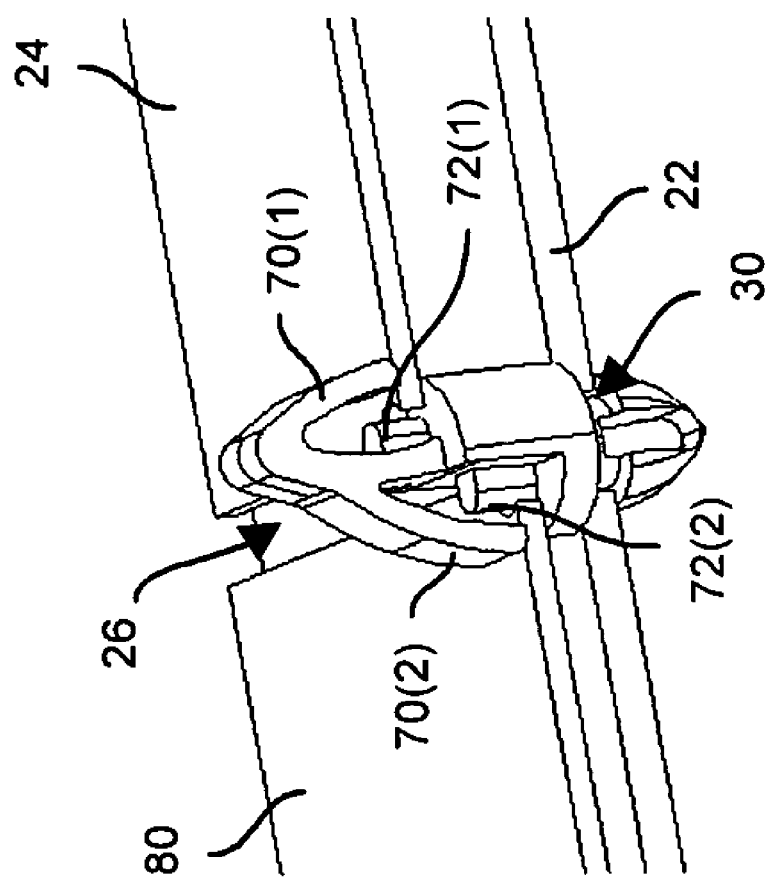
FIG. 5 is a detailed perspective view of the circuit board holder of FIG. 4 when holding the three circuit boards together.

FIG. 4 shows a side view of the connection system 20 when the circuit board holder 26 holds three circuit boards 22, 24, 80 together in a dual-height configuration, and FIG. 5 is a detailed perspective view of the circuit board holder 26 while interacting with the three circuit boards 22, 24, 80. As shown in FIGS. 4 and 5, the multiple deflectable latches 70 and the multiple tabs 72 enable the circuit board holder 26 to robustly hold multiple circuit boards 24, 80 (e.g., two daughter cards) to the main circuit board 22. For example, each of the circuit boards 24, 80 is capable of engaging a respective connector of the main circuit board 22 along a far edge 32(a) of that circuit board 24, 80 (FIG. 1). The circuit board holder 26 retains the near edge 32(c) of that circuit board 24, 80 to prevent the circuit board from inadvertently disconnecting (e.g., due to a shock or vibration). Accordingly, the circuit board holder 26 is capable of retaining multiple circuit boards 24, 80 to the main circuit board 22 simultaneously.

It should be understood that the capturing portion 54 of the circuit board holder 26 purposefully staggers the height of certain parts, e.g., the deflectable latches 70 and the tabs 72. Such staggering provides additional operational flexibility. For example, the circuit board holder 26 is capable of supporting a single circuit board 24, 80 at different heights. Such a feature is useful for certain types of connectors such as mini-PCI connectors which are available in two different heights since a manufacturer of the circuit board holder 26 is capable of managing a single design which is well-suited for a connector of either height. That is, for a circuit board 24, 80 at either height (e.g., when holding either one or two circuit boards to the main circuit board 22), the circuit board holder 26 is well-suited for holding the circuit board 24, 80 in a substantially parallel orientation to the main circuit board 22 (e.g., see FIGS. 4 and 5).

Figure 6:
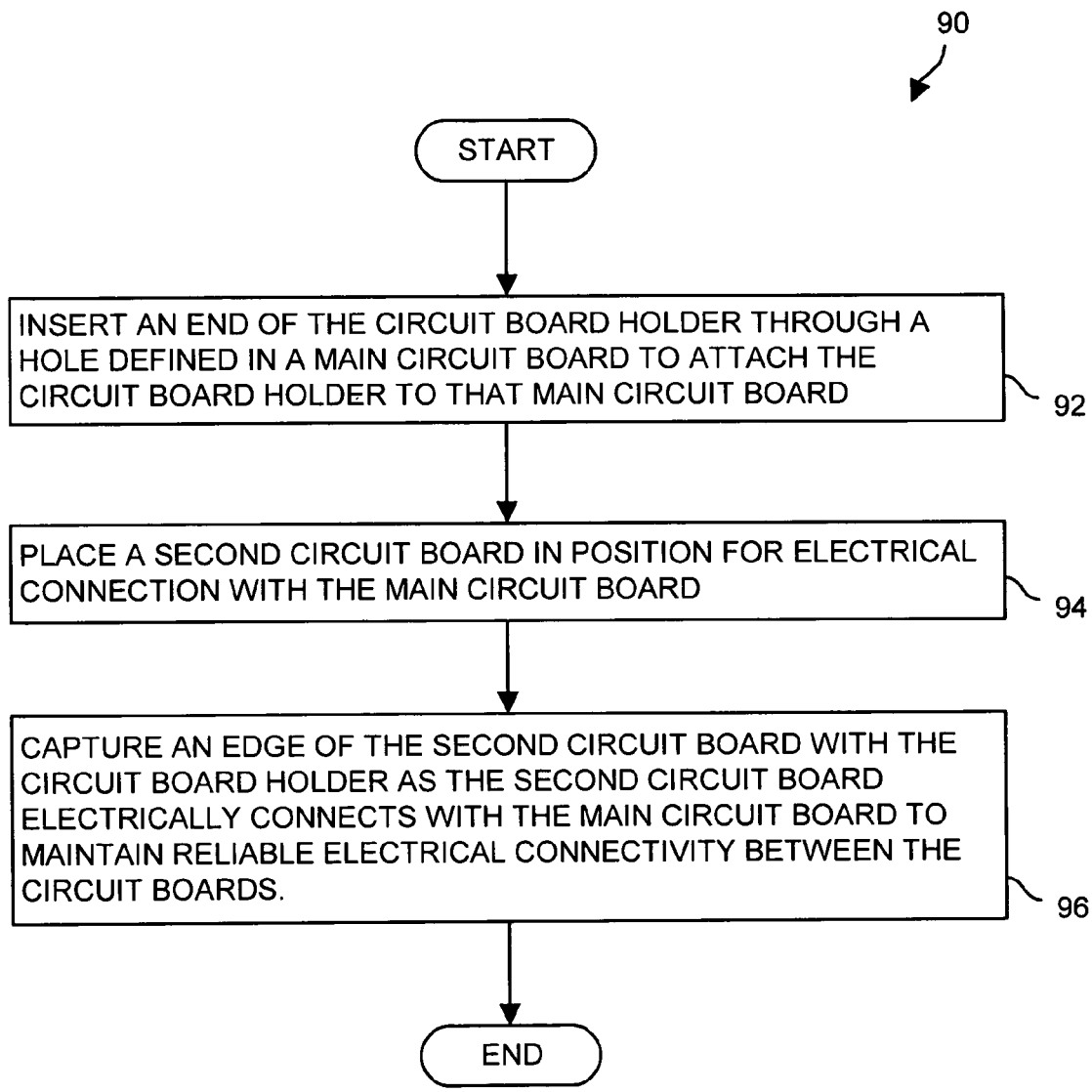
FIG. 6 is a flowchart of a procedure which is performed by a user of the circuit board holder of FIG. 2.

FIG. 6 is a flowchart of a procedure 90 which is performed by a user (e.g., a technician, automated equipment, etc.) of the circuit board holder 26 when forming the connection system 20 of FIG. 1. In step 92, the user inserts the end 66 of the circuit board holder 26 through the hole 30 defined in the main circuit board 22. As mentioned earlier, the tapered ramps 70 compress and expand while passing through the hole 30. As a result, the circuit board holder 26 is robustly fastened to the main circuit board 22.

In step 94, the user places the second circuit board 24 in position for electrical connection with the main circuit board 22. For example, the user inserts an edge 32(*a*) of the second circuit board 24 into engagement with a mini-PCI connector of the main circuit board 22 (e.g., illustrated by the arrow 34 in FIG. 1).

In step 96, the user captures an edge 32(*c*) of the second circuit board 24 with the circuit board holder 26 as the second circuit board 24 electrically connects with the main circuit board 22. For example, the user rotates the edge 32(*c*) in the counterclockwise direction 36 about the X-axis in FIG. 1 until the edge 32(*c*) locks into position within the capturing portion 54 of the circuit board holder 26 (also see FIGS. 2 and 3). At this point, the circuit board holder 26 maintains reliable electrical connectivity between the circuit boards 22, 24. Moreover, the procedure 90 is repeatable using the same circuit board holder 26 in order to connect another circuit board 80 (also see FIGS. 4 and 5) to the main circuit board 22.

As mentioned above, embodiments of the invention are directed to techniques for holding multiple circuit boards 22, 24 together using a circuit board holder 26 which attaches to a first circuit board 22 and captures an edge 32(*c*) of a second circuit board 24 to hold the second circuit board 24 in place. Such a holder 26 alleviates the need to consume a large amount of circuit board space on the second circuit board 24. Additionally, the reliable operation of the holder 26 enables the first and second circuit boards 22, 24 to maintain electrical connectivity even when exposed to heavy shock or vibration.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the circuit board holder 26 was explained above as operating on an edge 32(*c*) which opposes a connecting edge 32(*a*) which connects to the main circuit board 22 by way of example only. The circuit board holder 26 is capable of operating on other edges 32 as well such as on an edge 32 which is adjacent the connecting edge 32(*a*) (e.g., a far location along an adjacent edge 32(*b*) or 32(*d*)).

Additionally, it should be understood that the circuit board holder 26 is capable of latching with either one circuit board 24 (FIG. 1) or two circuit boards 24 and 80 (FIG. 4). Simple modifications can be made to the circuit board holder 26 to enable the circuit board holder to essentially latch N circuit boards to a main circuit board where N is a positive integer (e.g., 1, 2, 3, 4, etc.). Such modifications and enhancements are intended to belong to various embodiments of the invention.

What is claimed is:

1. A connection system, comprising:
   a first circuit board having a connector;
   a second circuit board which connects to the connector of the first circuit board; and
   a circuit board holder which holds the second circuit board in a substantially fixed position relative to the first circuit board while the second circuit board connects to the connector of the first circuit board, the circuit board holder including:
   a base portion,
   a mounting portion coupled to the base portion, the mounting portion being configured to actuate with the first circuit board when the circuit board holder attaches to the first circuit board, and
   a capturing portion coupled to the base portion, the capturing portion being configured to capture an edge of the second circuit board when the circuit board holder attaches to the first circuit board and when the second circuit board electrically connects with the first circuit board;
   wherein the capturing portion of the circuit board holder defines multiple deflectable latches; and
   wherein each deflectable latch is configured to latch a respective circuit board into a substantially fixed position relative to the first circuit board when the circuit board holder attaches to the first circuit board and when that respective circuit board electrically connects with the first circuit board.

2. The connection system of claim 1 wherein the first and second circuit boards are substantially plane-shaped; wherein an end of the mounting portion of the circuit board holder is configured to insert substantially perpendicularly through a hole defined by the first circuit board when the circuit board holder attaches to the first circuit board; and wherein the circuit board holder is configured to hold the first and second circuit boards substantially parallel to each other when the circuit board holder attaches to the first circuit board and when the second circuit board electrically connects with the first circuit board.

3. The connection system of claim 1 wherein the capturing portion of the circuit board holder defines a deflectable latch which is configured to (i) deflect in response to movement of the edge of the second circuit board toward the first circuit board to latch the second circuit board into a substantially fixed position relative to the first circuit board when the circuit board holder attaches to the first circuit board and when the second circuit board electrically connects with the first circuit board, and (ii) provide interference in response to movement of the edge of the second circuit board away from the first circuit board to retain the second circuit board in the substantially fixed position relative to the first circuit board when the circuit board holder attaches to the first circuit board and when the second circuit board electrically connects with the first circuit board.

4. A circuit board holder, comprising:
   a base portion;
   a mounting portion coupled to the base portion, the mounting portion being configured to actuate with a first circuit board when the circuit board holder attaches to the first circuit board; and
   a capturing portion coupled to the base portion, the capturing portion being configured to capture an edge of a second circuit board when the circuit board holder attaches to the first circuit board and when the second circuit board electrically connects with the first circuit board;

wherein the capturing portion defines multiple deflectable latches; and wherein each deflectable latch is configured to latch a respective circuit board into a substantially fixed position relative to the first circuit board when the circuit board holder attaches to the first circuit board and when that respective circuit board electrically connects with the first circuit board.

5. The circuit board holder of claim 4 wherein the first and second circuit boards are substantially plane-shaped; wherein an end of the mounting portion is configured to insert substantially perpendicularly through a hole defined by the first circuit board when the circuit board holder attaches to the first circuit board; and wherein the circuit board holder is configured to hold the first and second circuit boards substantially parallel to each other when the circuit board holder attaches to the first circuit board and when the second circuit board electrically connects with the first circuit board.

6. The circuit board holder of claim 5 wherein the circuit board holder defines an axis which is substantially perpendicular to the first circuit board when the circuit board holder attaches to the first circuit board; wherein the mounting portion defines a key disposed adjacent the base portion; and wherein the key, when positioned within the hole defined by the first circuit board, prevents rotation of the circuit board holder about the axis relative to the first circuit board.

7. The circuit board holder of claim 6 wherein the mounting portion further defines a pair of opposing tapered ramps which enable the end of the mounting portion to squeeze through the hole defined by the first circuit board when the circuit board holder attaches to the first circuit board.

8. The circuit board holder of claim 4 wherein the capturing portion defines a deflectable latch which is configured to (i) deflect in response to movement of the edge of the second circuit board toward the first circuit board to latch the second circuit board into a substantially fixed position relative to the first circuit board when the circuit board holder attaches to the first circuit board and when the second circuit board electrically connects with the first circuit board, and (ii) provide interference in response to movement of the edge of the second circuit board away from the first circuit board to retain the second circuit board in the substantially fixed position relative to the first circuit board when the circuit board holder attaches to the first circuit board and when the second circuit board electrically connects with the first circuit board.

9. The circuit board holder of claim 8 wherein the capturing portion further defines a tab disposed adjacent the base portion, the tab being configured to engage a corresponding notch along the edge of the second circuit board to prevent the second circuit board from sliding planarly relative to the first circuit board when the circuit board holder attaches to the first circuit board and when the second circuit board electrically connects with the first circuit board.

10. A circuit board holder, comprising:
a base portion;
a mounting portion coupled to the base portion, the mounting portion being configured to actuate with a first circuit board when the circuit board holder attaches to the first circuit board; and
a capturing portion coupled to the base portion, the capturing portion being configured to capture an edge of a second circuit board when the circuit board holder attaches to the first circuit board and when the second circuit board electrically connects with the first circuit board;

wherein the capturing portion defines a deflectable latch which is configured to (i) deflect in response to movement of the edge of the second circuit board toward the first circuit board to latch the second circuit board into a substantially fixed position relative to the first circuit board when the circuit board holder attaches to the first circuit board and when the second circuit board electrically connects with the first circuit board, and (ii) provide interference in response to movement of the edge of the second circuit board away from the first circuit board to retain the second circuit board in the substantially fixed position relative to the first circuit board when the circuit board holder attaches to the first circuit board and when the second circuit board electrically connects with the first circuit board; and wherein the capturing portion defines another deflectable latch which is configured to (i) deflect in response to movement of an edge of a third circuit board toward the first circuit board to latch the third circuit board into a substantially fixed position relative to the first circuit board when the circuit board holder attaches to the first circuit board and when the third circuit board electrically connects with the first circuit board, and (ii) provide interference in response to movement of the edge of the third circuit board away from the first circuit board to retain the third circuit board in the substantially fixed position relative to the first circuit board when the circuit board holder attaches to the first circuit board and when the third circuit board electrically connects with the first circuit board.

11. The circuit board holder of claim 10 wherein the deflectable latch is configured to retain the second circuit board at a first distance relative to the first circuit board; and wherein the other deflectable latch is configured to retain the third circuit board at a second distance relative to the first circuit board, the second distance being substantially different than the first distance.

12. The circuit board holder of claim 4 wherein each deflectable latch is disposed a different distance from the base portion to enable the circuit board holder to retain circuit boards at different heights relative to the first circuit board.

13. The circuit board holder of claim 4 wherein the circuit board holder defines a central axis; wherein the capturing portion defines a first deflectable latch which extends from the central axis in a first direction; and wherein the capturing portion defines a second deflectable latch which extends from the central axis in a second direction which is substantially opposite the first direction.

14. The circuit board holder of claim 4 wherein the mounting portion, the base portion and the capturing portion are formed simultaneously as an integrated body of non-metallic material by an injection molding process.

15. A circuit board holder, comprising:
a base portion;
a mounting portion coupled to the base portion, the mounting portion being configured to actuate with a first circuit board when the circuit board holder attaches to the first circuit board; and
means, coupled to the base portion, for capturing an edge of a second circuit board when the circuit board holder attaches to the first circuit board and when the second circuit board electrically connects with the first circuit board;

wherein the means for capturing defines multiple deflectable latches; and wherein each deflectable latch is configured to latch a respective circuit board into a substantially fixed position relative to the first circuit board when the circuit board holder attaches to the first circuit board and when that respective circuit board electrically connects with the first circuit board.

16. The circuit board holder of claim 15 wherein the first and second circuit boards are substantially plane-shaped; wherein an end of the mounting portion is configured to insert substantially perpendicularly through a hole defined by the first circuit board when the circuit board holder attaches to the first circuit board; and wherein the multiple deflectable latches form at least a portion of means for holding the first and second circuit boards substantially parallel to each other when the circuit board holder attaches to the first circuit board and when the second circuit board electrically connects with the first circuit board.

17. The circuit board holder of claim 15 wherein the multiple deflectable latches form at least a portion of:

means for deflecting in response to movement of the edge of the second circuit board toward the first circuit board to latch the second circuit board into a substantially fixed position relative to the first circuit board when the circuit board holder attaches to the first circuit board and when the second circuit board electrically connects with the first circuit board, and means for providing interference in response to movement of the edge of the second circuit board away from the first circuit board to retain the second circuit board in the substantially fixed position relative to the first circuit board when the circuit board holder attaches to the first circuit board and when the second circuit board electrically connects with the first circuit board.

18. A method for holding circuit boards together, the method comprising:

inserting an end of a circuit board holder through a hole defined in a first circuit board to attach the circuit board holder to the first circuit board;

placing a second circuit board in position for electrical connection with the first circuit board; and capturing an edge of the second circuit board with the circuit board holder as the second circuit board electrically connects with the first circuit board to maintain reliable electrical connectivity between the first and second circuit boards, wherein the circuit board holder includes multiple deflectable latches, and wherein each deflectable latch is configured to latch a respective circuit board into a substantially fixed position relative to the first circuit board when the circuit board holder attaches to the first circuit board and when that respective circuit board electrically connects with the first circuit board.

19. The connection system of claim 1 wherein the circuit board holder is configured to position the second circuit board and a third circuit board at staggered heights relative to the first circuit board.

20. The circuit board holder of claim 4 wherein the circuit board holder is configured to position the second circuit board and a third circuit board at staggered heights relative to the first circuit board.

21. The circuit board holder of claim 15 wherein the circuit board holder is configured to position the second circuit board and a third circuit board at staggered heights relative to the first circuit board.

22. The method of claim 18 wherein the circuit board holder is configured to position the second circuit board and a third circuit board at staggered heights relative to the first circuit board.

\* \* \* \* \*